US006785874B2

(12) United States Patent
Tsukuda

(10) Patent No.: US 6,785,874 B2
(45) Date of Patent: Aug. 31, 2004

(54) LAYOUT VERIFICATION METHOD, PROGRAM THEREOF, AND LAYOUT VERIFICATION APPARATUS

(75) Inventor: Eiji Tsukuda, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 256 days.

(21) Appl. No.: 10/192,675

(22) Filed: Jul. 11, 2002

(65) Prior Publication Data

US 2003/0037308 A1 Feb. 20, 2003

(30) Foreign Application Priority Data

Aug. 16, 2001 (JP) ........................................ 2001-247016

(51) Int. Cl.[7] .............................................. G06F 9/45
(52) U.S. Cl. .............................. 716/5; 716/4; 716/19; 716/21; 430/5
(58) Field of Search ............................. 716/11, 19, 21; 703/15; 430/5; 438/129; 382/151; 347/147; 324/751; 257/786, 443

(56) References Cited

U.S. PATENT DOCUMENTS

| | | | | |
|---|---|---|---|---|
| 5,441,834 A | * | 8/1995 | Takekuma et al. | 430/5 |
| 6,539,521 B1 | * | 3/2003 | Pierrat et al. | 716/4 |
| 6,553,562 B2 | * | 4/2003 | Capodieci et al. | 716/19 |
| 6,577,994 B1 | * | 6/2003 | Tsukuda | 703/15 |
| 6,629,292 B1 | * | 9/2003 | Corson et al. | 716/3 |

FOREIGN PATENT DOCUMENTS

JP 2001-014376 1/2001

OTHER PUBLICATIONS

Schellenberg et al., "Impact of RET on physical layouts", Apr. 2001, Proceedings of the 2001 International symposium on physical design, ACM, pp.: 52–55.*

* cited by examiner

Primary Examiner—Leigh M. Garbowski
Assistant Examiner—Helen B Rossoshek
(74) Attorney, Agent, or Firm—Oblon, Spivak, McClelland, Maier & Neustadt, P.C.

(57) ABSTRACT

Provided are a layout verification apparatus and a layout verification method, each employing an L/S matrix to achieve higher accuracy of verification, as well as a program thereof. The layout verification method is realized by dividing each segment in accordance with the layout of its surrounding other polygon. For instance, in FIG. 3, since the left side of polygon (P1) (i.e., segment Segc) is, over its entire segment length, most adjacent to polygon (P5), this side is not divided. Since the upper side of the polygon (P1) is, only in part of its segment length, most adjacent to polygon (P7) within distance (R), this side is divided into segment (Segb1) that corresponds to the part adjacent to the polygon (P7), and segment (Segb2) that is the rest. Then, the L/S matrix is referred to segment by segment, to judge whether the polygon can be resolved.

7 Claims, 13 Drawing Sheets

F I G . 1 2
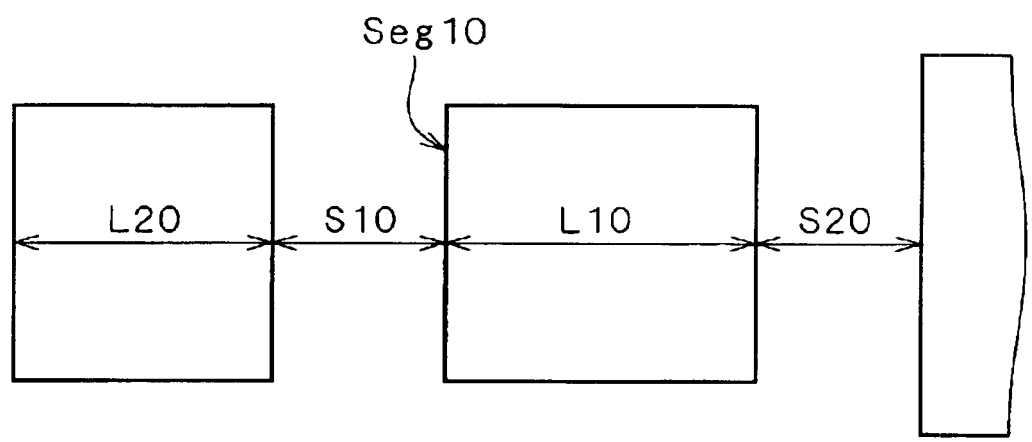

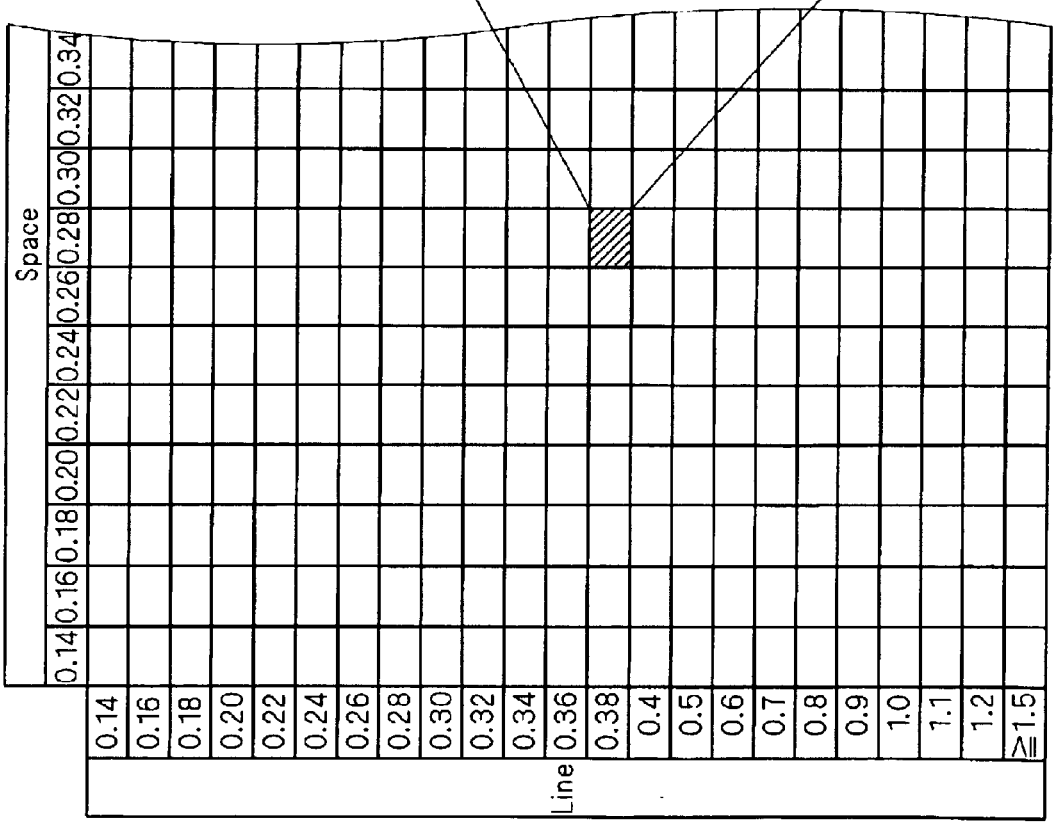

LAYOUT VERIFICATION METHOD, PROGRAM THEREOF, AND LAYOUT VERIFICATION APPARATUS

BACKGROUND OF THE INVENTION

1. Field of the Invention

The present invention relates to a layout verification method of verifying layouts of semiconductor integrated circuits and a program thereof, as well as a layout verification apparatus.

2. Description of the Background Art

Recently, to comply with high integration and miniaturization of semiconductor integrated circuits, a rapid progress has been made in miniaturizing resist patterns formed on wafers and mask patterns for forming the resist patterns. In photolithography technique, in order to increase resolution as miniaturization is advanced, super resolution technique is being used as a method other than reducing the wavelength of a light source. As the super resolution technique, there are techniques called "Levenson method" and "modified illumination method," respectively.

These methods comply with the miniaturization as follows. In Levenson method, a phase shifter is disposed on a mask to increase the resolution of a resist pattern to be formed on a wafer. In the modified illumination method, the shape of a light source itself is changed to increase the resolution of a resist pattern to be formed on a wafer. The use of these super resolution techniques permit a further miniaturized resist pattern, however, there might occur a dimensional variation different from that in conventional ones.

Specifically, in the method using no super resolution technique, it is arranged to prohibit layouts below resolution limitations of the line width of a wiring pattern and the space width (spacing width between lines). This provides a mask pattern layout on which the line width and the space width are both above the resolution limitations. As a result, there occurs no large dimensional variation between the mask pattern and a pattern to be formed on a resist (i.e., the finished pattern), and the dimensional variation of the finished pattern falls within a predictable range.

On the other hand, when using the super resolution technique, the resolution limitations of the line width and space width can be made small. However, in a certain dimensional range, the finished pattern dimension is far larger or smaller than a mask pattern. In some cases, the finished pattern dimension exceeds a permissible limit. It is also difficult to predict this.

Referring to FIG. 16, as is usual in manufacturing semiconductor devices, a circuit design and operation verification of the designed circuit are performed (step S101), followed by a layout design of a mask pattern for forming the circuit on a wafer (step S102). Subsequently, it is verified whether the layout thus obtained is proper or not (step S103), followed by a wafer making process (step S104).

In performing the layout design, it is required not be in contravention of (i.e., be free from errors in) a design rule (referred to as "DR" in some cases) R1 that is determined based on restrictions of a process to be used. Hereat, the design rule is used in the layout design and layout verification in steps S102, S103, to specify the line width of wiring and the space width between wirings. Also, the design rule is to be limited by the wafer process.

In performing the layout verification, a design rule check (DRC) C1 is performed to check, for example, whether the designed layout is in accordance with the design rule R1.

Thus, the technique comprising making a predetermined rule and verifying a layout based on the result of checking whether it is contravention of the rule, is called "rule base verification." In the present circumstances where the above-mentioned super resolution technique is generally used, the design rule R1 to be employed in the rule base verification is considerably complicated.

When using no super resolution technique in photolithography that is an exemplary wafer process, a design rule for the same layer is relatively simple. That is, the design rule is obtained only by specifying a minimum line width and a minimum space width, which indicate the limitation of the wafer process (e.g., the resolution limitation in photolithography technique).

On the other hand, when using the super resolution technique in a wafer process, a complicate design rule is required to comply with this technique. For instance, when forming a plurality of wiring patterns paralleling and having plural types of space widths, mere specifying of a minimum line width and a minimum space width is insufficient. It is therefore required to judge whether resolution is possible in a combination of a line width and a space width, that is, whether the finished pattern dimension exceeds a permissible limit.

Further, situations arise where no rule can be made, and the incidence of errors might be overlooked. Since the rule specifies the degree to which a pattern deviates, versatility is poor, thus making it difficult to comply with every pattern.

To overcome this problem, recently employed is a technique using optical simulation, which is called "model base verification."

The optical simulation is technique of predicting the shape of a finished pattern of layout. Therefore, in the model base verification, a design rule complying with the super resolution technique can be made based on the predicted finished pattern shape. The actual simulation enables to understand exactly every layout pattern and its surrounding situations. Although the degree to which the pattern formation deviates depends on the simulation accuracy, this is recognizable with considerably more accuracy than the rule base verification.

However, the model base verification suffers from the drawback that, due to optical simulation, quite a long time is needed in predicting a finished pattern shape, thereby making it difficult to perform sufficient process evaluation such as the degrees of a defocus margin and an exposure margin.

Upon this, a technique of combining the model base verification and the rule base verification has been proposed. In this technique, optical simulation of the finished pattern of each layout is not performed design by design. In advance, the components of a pattern are subjected to optical simulation under a certain standardized conditions. Then, the design rule obtained by the simulation is applied to verification, thereby increasing verification accuracy and also reducing the time required therefor. Process evaluation can be performed with ease by associating the amounts of a defocus margin, an exposure margin or the like with the rule of components forming each pattern, although this makes the design rule complicated.

FIGS. 17 and 18 are diagrams illustrating an exemplary method of process evaluation in the verification technique mentioned above. This method is, for example, described in Japanese Patent Application Laid-Open No. 2001-014376 (2001).

Referring now to FIG. 17, each wiring pattern such as of wirings and gate electrodes is expressed by graphic data called "polygon." FIG. 17 exemplifies four polygons P11, P22, P33 and P44. Each polygon is made up of a plurality of sides that are called "segment." For example, the polygon P11 is made up four sides of the segments Seg1 to Seg4.

In the process evaluation, there has been employed a method of making a matrix table, as shown in FIG. 18. To complete the matrix table, optical simulation is performed segment by segment, to obtain its evaluation data. FIG. 18 shows a data table called "L (line)/S (space) matrix," on which the ordinate and abscissa represent a plurality of numerical values of line widths and space widths of a wiring pattern, respectively, for convenience in understanding a plurality of combinations of line width and space width.

In FIG. 18, the ordinate indicates the numerical values of line widths (unit: $\mu$m), on which the numerical values from 0.14 $\mu$m to 0.4 $\mu$m are graduated in 0.02 $\mu$m, the numerical values from 0.4 $\mu$m to 1.2 $\mu$m are graduated in 0.1 $\mu$m, and the last value is not less than 1.5 $\mu$m. The abscissa indicates the numerical values of space widths, and they are likewise graduated as the line widths.

In addition to data of the possibility of resolution with respect to the wiring pattern, various data as shown in FIG. 18, which are obtained by experiments or simulations, are stored in each cell of the L/S matrix. As example of the various data, FIG. 18 illustrates an original dimension of an L/S pattern, its finished dimension, a difference between the original dimension and the finished dimension, a defocus margin, an exposure margin, a dimple margin, an OPC (optical proximity correction) amount, and other data.

This L/S matrix is used as follows. First, a certain segment is selected, and a line width and a space width, which are defined as a distance in the normal direction up to other segment, are judged from each layout pattern. In FIG. 17, for instance, the segment Seg1 has a line width of L2 and a space width of S1. The segment Seg2 has a line width of L1 and a space width of S2. The next step is to find from the L/S matrix a cell corresponding to the line width L2 and the space width S1. Then, the selected segment is subjected to, for example, evaluation of margin by referring to the various data stored in the corresponding cell.

Thus, the use of the L/S matrix makes it easy to perform process evaluation. In this respect, the L/S matrix is a matrix data storing the conditions under which resolution can be performed.

However, in some cases, it is not so easy to determine the line widths and space widths of segments, as in FIG. 17. Consider now the following layout with reference to FIG. 17. When the length of polygon P33 is smaller than the length of polygon P11, namely line width L2, (e.g., when the length of the polygon P33 is only about a half of the line width L2), the space width of segment Seg4 may not always be S4.

Even in this case, the space width of the segment Seg4 has conventionally been regarded as S4, because each side of a polygon has been simply taken as a segment. Hence, there is room for improving verification accuracy.

SUMMARY OF THE INVENTION

According to a first aspect of the invention, there is provided a layout verification method using a layout data of a semiconductor integrated circuit, the layout data containing plural polygons indicating wiring patterns, the polygons being made up of plural segments that are sides, the method comprising the steps of: (a) dividing plural segments forming one of the plural polygons in the layout data, based on a predetermined rule defined beforehand relative to the layout of other surrounding polygon; (b) with respect to the segments divided and segments not divided, detecting a width of wiring containing each of the segments and a width of space most adjacent to each of the segments; (c) evaluating the possibility of resolution of each of the segments by referring to data of conditions under which resolution can be performed, in which a predetermined conditions relative to the possibility of resolution of the segments in a wafer process is stored in association with a combination of the width of wiring and the width of space; and (d) outputting an error information when there is a segment of which possibility of resolution is negative based on the result of evaluation in the step (c).

According to a second aspect of the invention, the layout verification method of the first aspect is characterized in that the predetermined rule means that no division is performed when one segment is, over its entire length, most adjacent to the other polygon, and division is performed when one segment is, only in part of its length, most adjacent to the other polygon within a predetermined distance.

According to a third aspect of the invention, the layout verification method of the first aspect is characterized in that a layout correction amount of the segments is stored in the data of conditions under which resolution can be performed; and that there is added the step of: (e) when the error information is outputted in the step (d), correcting by the correction amount the layout of a segment of which possibility of resolution is negative, while referring to the data of conditions under which resolution can be performed.

According to a fourth aspect of the invention, the layout verification method of the first aspect is characterized in that in the combination of the width of wiring and the width of space in the data of conditions under which resolution can be performed, there is included a combination of a width of wiring containing an aimed segment of the segments and a width of space most adjacent to the aimed segment, as well as a width of wiring not containing the aimed segment and/or a width of space not being most adjacent to the aimed segment.

According to a fifth aspect of the invention, the layout verification method of the first aspect is characterized in that the polygons contained in the layout data are wiring patterns of oblique lines where the wiring and the space are disposed obliquely at a predetermined angle on a plane.

According to a sixth aspect of the invention, the layout verification method of the first aspect is characterized in that the polygons contained in the layout data are hole patterns taking the width of wiring as a hole diameter and the width of space as a width of space between holes.

According to a seventh aspect of the invention, the layout verification method of the first aspect is characterized in that the predetermined condition is defined based on a defocus margin.

In the first, fifth, sixth or seventh aspect of the invention, in the layout data, each of segments forming one of the plural polygons is divided based on the predetermined rule relative to the layout of its surrounding other polygon. This permits more accurate evaluation in the step (c) for evaluating the possibility of resolution of the respective segments, resulting in a layout verification method that is higher in verification accuracy.

In the second aspect of the invention, the predetermined rule in the step (a) means to perform no division when one segment is, over its entire length, most adjacent to other polygon, and to perform division when one segment is, only in part of its length, most adjacent to other polygon within the predetermined distance. Thereby, in the step (a), a wiring pattern shape can be divided in further detail, while avoiding an increase in the amount of calculation.

In the third aspect, in the step (e), with respect to the segment of which possibility of resolution is negative, its layout is corrected by the amount of correction, while referring to the data of the conditions under which resolution can be performed. This makes it easy to obtain a suitable layout.

In the fourth aspect, in the combination of the wiring width and space width in the data of the conditions under which resolution can be performed, there is included a combination of the width of wiring containing an aimed segment of the segments and the width of space most adjacent to the aimed segment, as well as the width of wiring not containing the aimed segment and/or the width of space not being most adjacent to the aimed segment. This permits evaluation that is based on close consideration of the wiring width and space width in the surroundings of the segments.

It is an object of the present invention to provide a layout verification apparatus and a layout verification method, each employing an L/S matrix to achieve higher accuracy of verification, as well as a program thereof.

These and other objects, features, aspects and advantages of the present invention will become more apparent from the following detailed description of the present invention when taken in conjunction with the accompanying drawings.

BRIEF DESCRIPTION OF THE DRAWINGS

FIG. 12 is a diagram illustrating wiring widths and space widths, which exert adverse influence on the resolution of segments;

FIG. 18 is a diagram showing an L/S matrix and various data stored in each cell of the matrix.

DESCRIPTION OF THE PREFERRED EMBODIMENTS

First Preferred Embodiment

A first preferred embodiment realizes a layout verification method that is higher in verification accuracy, by dividing each segment in accordance with the layout of its surrounding other polygon.

Figure 1:
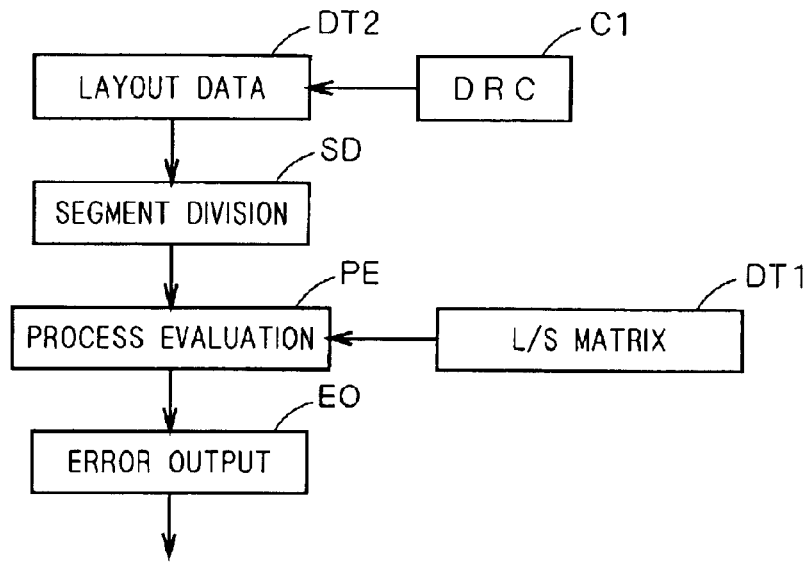
FIG. 1 is a flowchart illustrating a layout verification method according to a first preferred embodiment of the invention.

FIG. 1 is a flowchart illustrating the layout verification method of this embodiment. The flow of FIG. 1 is executed in step S103 for performing the layout verification in FIG. 16.

Referring to FIG. 1, in this layout verification method, a layout data DT2 of a semiconductor integrated circuit is subjected to segment division processing in a segment division step SD, and the resulting data is subjected to evaluation of the possibility of resolution in a process evaluation step PE. When the possibility of resolution is negative, an error information is outputted in an error output step EO. The error information is then fed back to a layout design step S102 in FIG. 16.

The followings are detailed description of the respective steps. The layout data DT2 to be applied to the segment division step SD contain a plurality of polygons made up of a plurality of sides (segments). Hereat, the layout data DT2 is already subjected to a design rule check C1 (but, which is not yet subjected to check using an L/S matrix).

In the segment division step SD, one of the polygons in the layout data DT2 is selected, and each of segments forming the selected polygon is divided in accordance with the layout of its surrounding other polygon. This processing will be described by referring to FIGS. 2 and 3.

Figure 2:
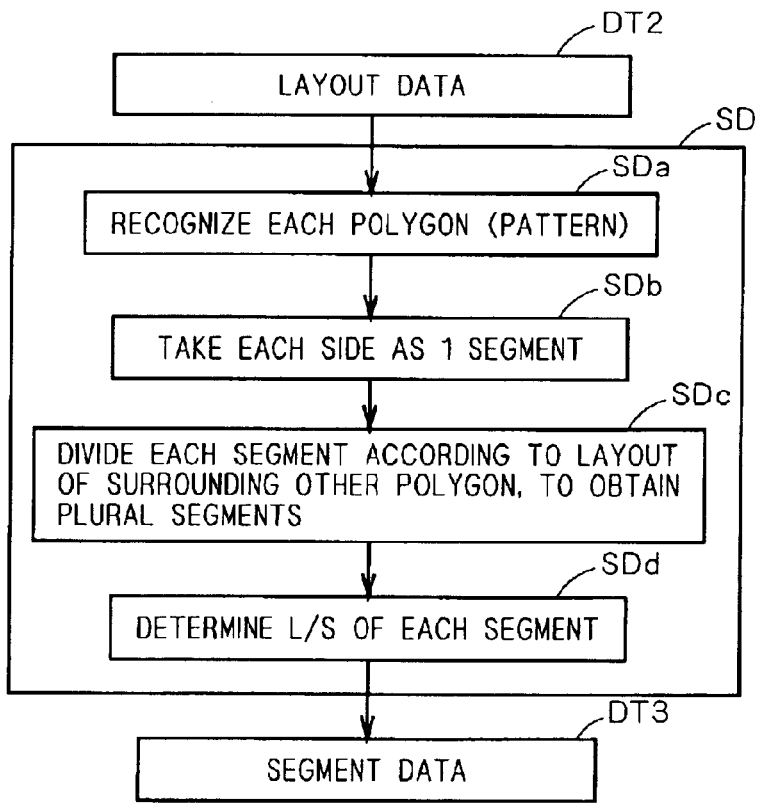
FIG. 2 is a diagram illustrating a further detail flow of the segment division step.
Figure 3:
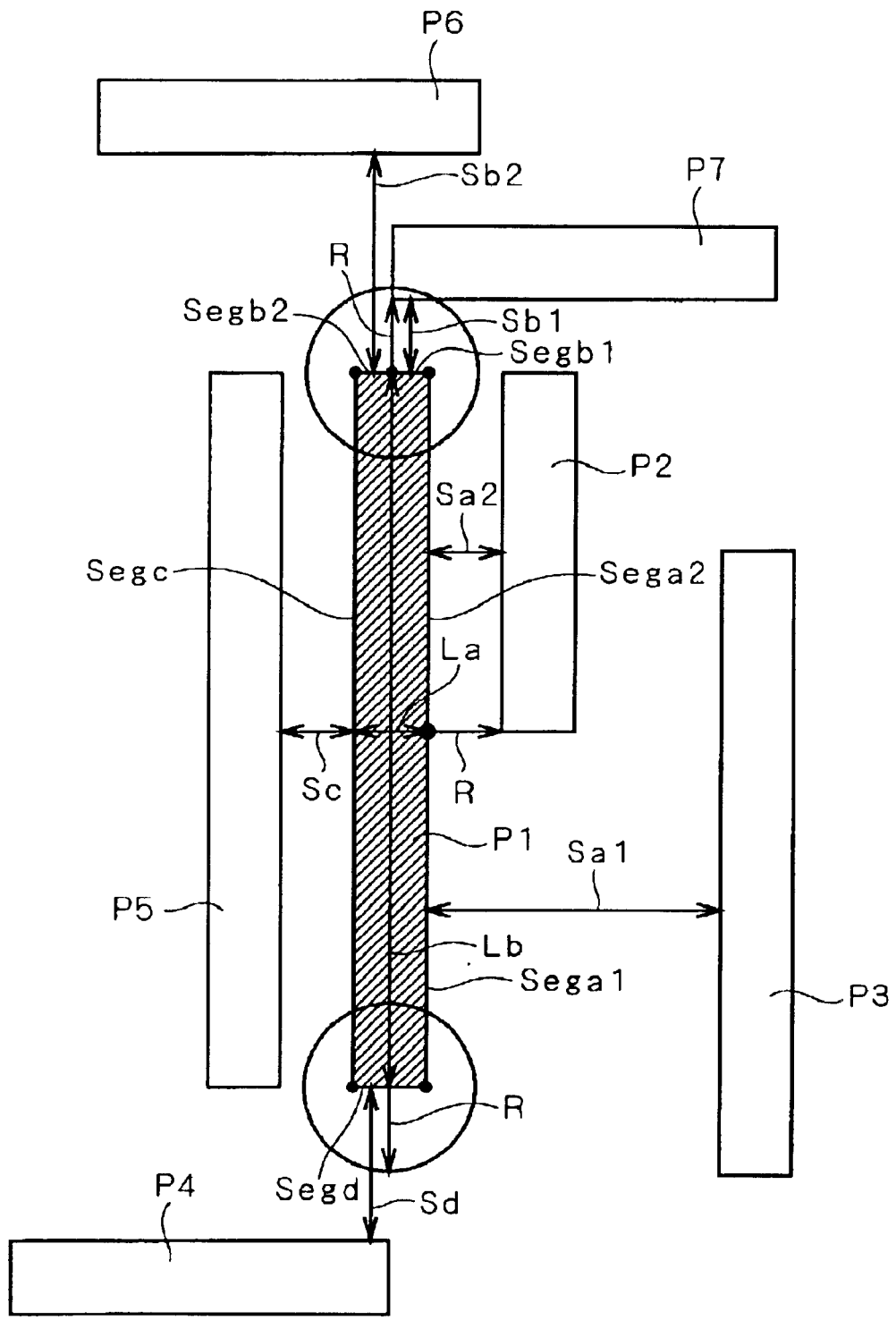
FIG. 3 is a diagram illustrating an exemplary segment division in a polygon.

FIG. 2 is a diagram illustrating a further detail flow of the segment division step SD. FIG. 3 is a diagram illustrating an exemplary division of a segment of polygons. As shown in FIG. 2, in the segment division step SD, firstly, the polygons in the layout data DT2 are recognized (step SDa). From the recognized polygons, one polygon is selected as an object, and each side of the polygon is recognized and taken as 1 segment (step SDb).

Referring to FIG. 3, plural polygons P1 to P7 in the layout data DT2 are firstly recognized, and the polygon P1 is selected therefrom as an object. Each side of the polygon P1 is taken as 1 segment. The polygon P1, which is a rectangle, should be recognized that it is made up of four segments.

Subsequently, each segment of the selected polygon is divided in accordance with the layout of its surrounding other polygon (step SDc). With respect to the segments subjected to division and segments not subjected to division, width (L) of wiring containing the segments and width (S) of space most adjacent to the segments are detected (step SDd). Thus, a segment data DT3 is generated from the layout data DT2.

Hereat, to divide in accordance with the layout of its surrounding other segment means to perform division under a predetermined rule. That is, no division is performed when one segment is, over its entire length, most adjacent to other polygon, whereas division is performed when one segment is, only in part of its length, most adjacent to other polygon within a predetermined distance.

Referring to FIG. 3, for instance, the left side of polygon P1 (i.e., segment Segc) is, over its entire segment length, most adjacent to polygon P5. Therefore, no division is performed with respect to the left side of polygon P1. The L/S of the segment Segc are La and Sc in FIG. 3.

The upper side of the polygon P1 is, only in part of its segment length, most adjacent to polygon P7 within distance R. In this instance, the upper side of the polygon P1 is divided into segment Segb1 that corresponds to the part adjacent to the polygon P7, and segment Segb2 that is the rest. The L/S of the segment Segb1 are Lb and Sb1, and the L/S of the segment Segb2 are Lb and Sb2, in FIG. 3.

Likewise, the right side of the polygon P1 is, only in part of its segment length, most adjacent to polygon P2 within distance R. Also, in this instance, the right side of the polygon P1 is divided into segment Sega2 that corresponds to the part adjacent to the polygon P2, and segment Sega1 that is the rest. The L/S of the segment Sega1 are La and Sa1, and the L/S of the segment Sega2 are La and Sa2, in FIG. 3.

The lower side of the polygon P1 is, only in part of its segment Segd length, most adjacent to polygon P4, which is however not within distance R. Therefore, no division is performed. The L/S of the segment Segd are Lb and Sd in FIG. 3.

The reason for adding the condition as to whether it is within distance R is to prevent the amount of calculation from increasing due to subdivision of any segment that is adjacent, in part of its length, to other polygon. Hence, distance R should be set in consideration of whether the most adjacent polygon is so proximate as to adversely affect the finished pattern.

As described above, no division is performed when one segment is, over its entire length, most adjacent to other polygon, and division is performed when one segment is, only in part of its length, most adjacent to other polygon within a predetermined distance. This way, the shape of a wiring pattern can be divided in further detail, while avoiding an increase in the amount of calculation.

As algorithm for detecting the L/S of each segment, there is, for example, the following technique. First, each segment is recognized as a vector. Then, each normal vector of each segment is extended until it comes into contact with the most adjacent segment. The length of the normal vector at that time is used as L/S.

In the process evaluation step PE, the possibility of resolution of each segment is evaluated with the segment data DT3 generated in the segment division step SD. At this time, the L/S matrix DT1 is referred to. This processing will be described by referring to FIGS. 4 and 5.

Figure 4:
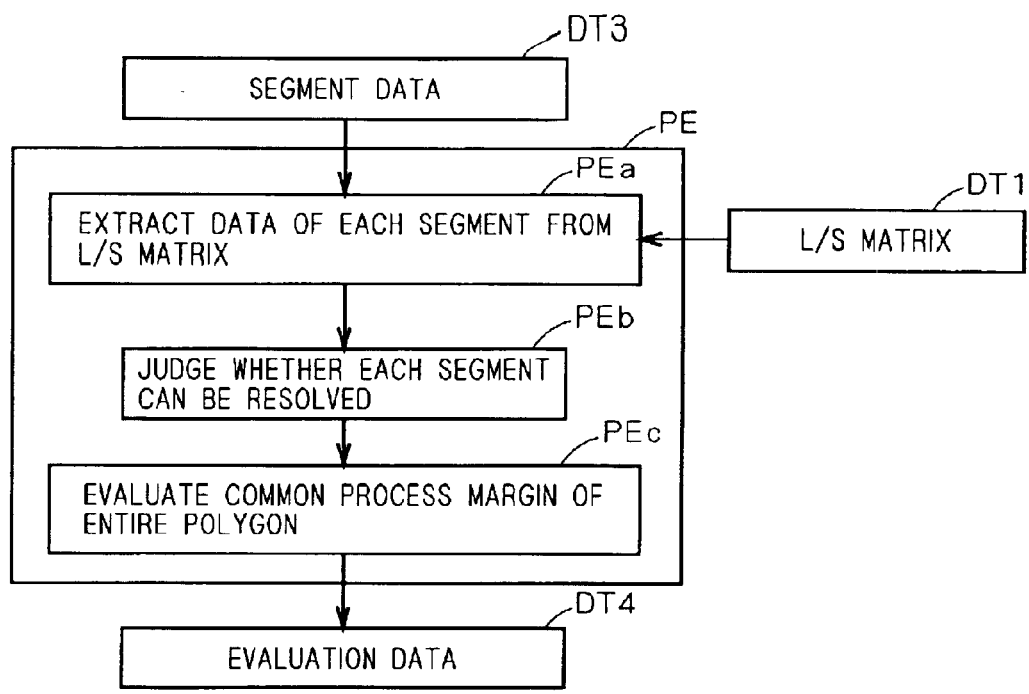
FIG. 4 is a diagram illustrating a further detail flow of the process evaluation step.
Figure 5:
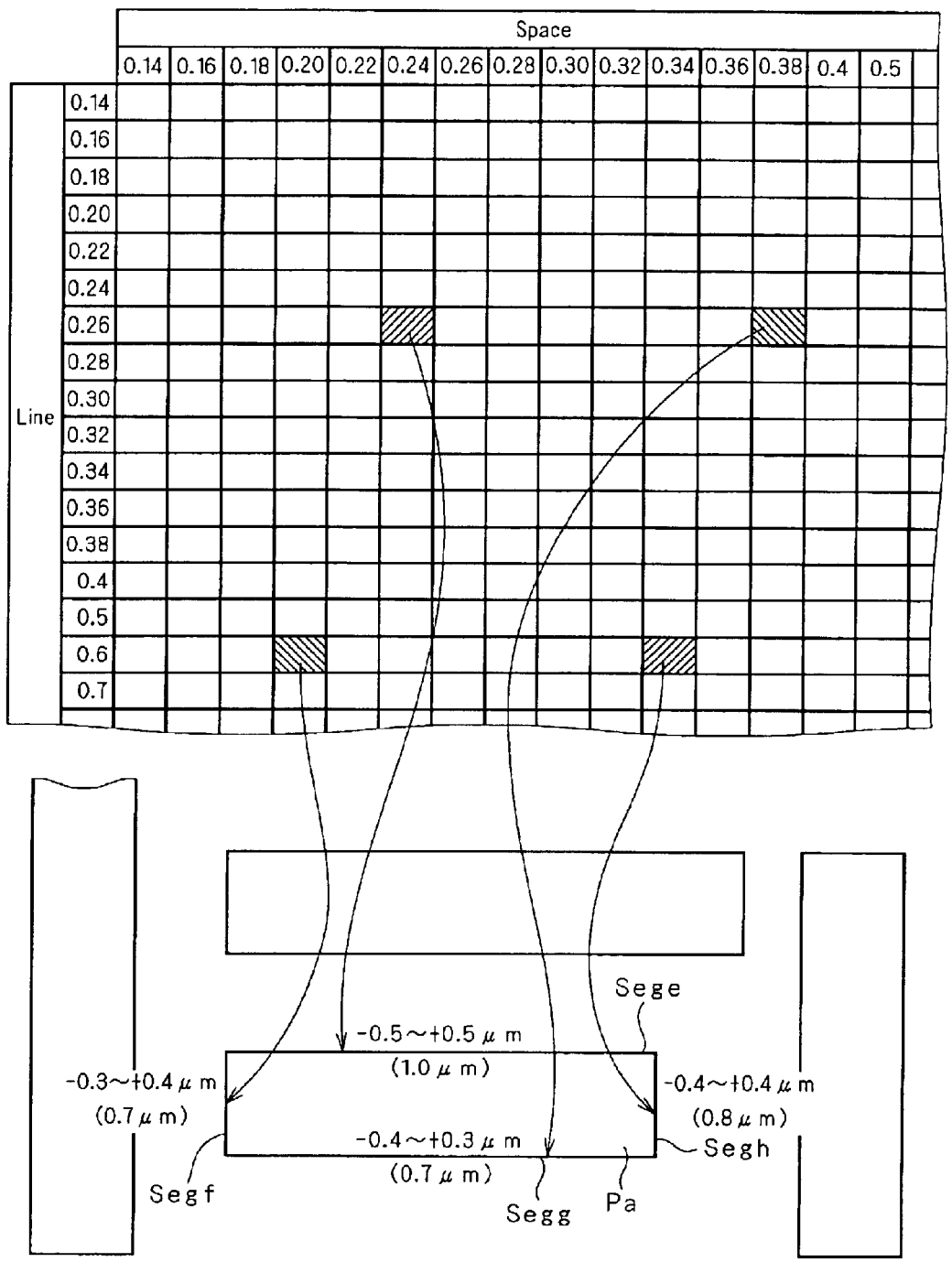
FIG. 5 is a diagram illustrating the instance that as an exemplary evaluation of segments, a defocus margin is adopted for the conditions under which resolution of a wiring pattern can be performed.

FIG. 4 is a diagram illustrating a further detail flow of the process evaluation step PE. FIG. 5 is a diagram illustrating the instance that as an exemplary evaluation of segments, a defocus margin is adopted for the conditions under which resolution of a wiring pattern can be performed. As shown in FIG. 4, in the process evaluation step PE, with respect to each segment in the segment data DT3, information about the possibility of resolution stored in the corresponding cell (i.e., information of the possibility of resolution, and various data) is extracted from the L/S matrix DT1 (step PEa).

In every cell of the L/S matrix, the information of the possibility of resolution is stored in the indication of, for example, "resolution is possible" or "resolution is impossible." The various data are stored in every cell in the same fashion shown in FIG. 18.

The following description will proceed on the assumption that both of the information about the possibility of resolution and the various data are stored in every cell of the L/S matrix. However, if the possibility of resolution can be determined by analyzing the various data, only the various data may be stored in every cell. Even when the information about the possibility of resolution indicates "resolution is possible," it can be considered that resolution would be impossible depending on the layout of the surrounding polygon. Therefore, in order to make accurate judgment in the following step PEb, it is desirable to store data item as many as possible (Note that increasing the number of data item increases the amount of calculation).

Based on the data extracted in the step PEa, the possibility of resolution of each segment (as to whether resolution is difficult or impossible) is judged (step PEb). This judgment may be made only by referring to the item of "resolution is possible" or "resolution is impossible" stored in each cell of the L/S matrix, alternatively, by analyzing one or a plurality of the various data stored therein.

Consider here the case that the possibility of resolution is judged by analyzing "defocus margin," which is also called "DOF" (depth of focus), in the various data, when segments Sege, Segf, Segg and Segh of polygon Pa have the following defocuses from a reference focus plane, as shown in FIG. 5. That is, the defocus of the segment Sege is from −0.5 to +0.5 $\mu$m (its defocus margin corresponds to a range therebetween, i.e., 1.0 $\mu$m). The defocus of the segment Segf is from −0.3 to +0.4 $\mu$m (its defocus margin is 0.7 $\mu$m). The defocus of the segment Segg is from −0.4 to +0.3 $\mu$m (its defocus margin is 0.7 $\mu$m). The defocus of the segment Segh is from −0.4 to +0.4 $\mu$m (its defocus margin is 0.8 $\mu$m).

In this instance, if an actual focus plane is located between −0.3 $\mu$m at which the absolute value becomes the minimum in the minus defocuses, and +0.3 $\mu$m at which the absolute value becomes the minimum in the defocuses on the plus defocuses, it can be said that the polygon Pa is reliably resolved. Common defocus margin in this case is 0.6 $\mu$m, which is the range of variation between −0.3 $\mu$m and +0.3 $\mu$m.

Provided that the defocus in an exposure apparatus for actual wafer process occurs only in the range of variation between −0.2 $\mu$m and +0.2 $\mu$m from a reference focus plane (i.e., the range of variation is only 0.4 $\mu$m). Polygon Pa having the segments Sege to Segh has an absolute value of defocus greater than both of −0.2 $\mu$m and +0.2 $\mu$m, and its common defocus margin is 0.6 $\mu$m, which is greater than the range of variation, 0.4 $\mu$m. Therefore, it is judged that the polygon Pa can be resolved.

In contrast, provided that the defocus in an exposure apparatus for actual wafer process occurs in the range of variation from −0.5 $\mu$m to +0.5 $\mu$m from a reference focus plane, it might exceed the defocus ranges of the segments Segf, Segg and Segh of the polygon Pa. Therefore, it is judged that the possibility of resolution of the polygon Pa is negative.

Thus, the defocus and defocus margin are evaluated with respect to all segments contained in one polygon, thereby evaluating the possibility of resolution of the polygon (step PEc). This way, an evaluation data DT4 is generated from the segment data DT3.

The evaluation data DT4 stores, for example, such a process evaluation that "it is difficult to perform resolution because the range of variation of defocus in the exposure apparatus exceeds the defocus margin of segment Segf of polygon Pa by 0.2 $\mu$m on the plus side and 0.3 $\mu$m on the minus side," as well as information such as "resolution is possible" or "resolution is impossible" as described above.

The contents of the evaluation data DT4 is then considered in an error output step EO. For instance, when the information of "resolution is impossible" is stored in the evaluation data DT4, an error information such as "fatal error is present" with respect to the polygon may be outputted in the error output step EO.

When a process evaluation, such as the common defocus margin previously described, is stored in the evaluation data DT4, with respect to the above polygon, it may be arranged to output the following error information that "Note that it is difficult to perform resolution because the range of variation of defocus in the exposure apparatus exceeds the defocus margin of segment Segf of polygon Pa by 0.2 μm on the plus side and 0.3 μm on the minus side."

Figure 16:
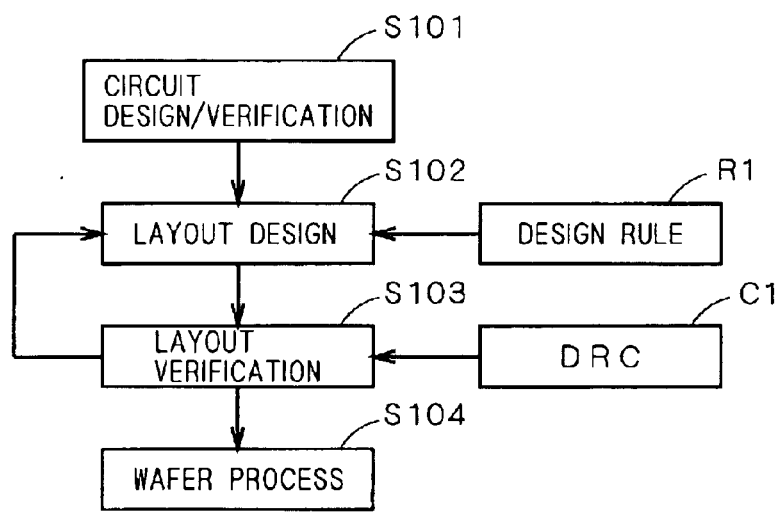
FIG. 16 is a diagram of a manufacturing flow of a semiconductor device.
Figure 17:
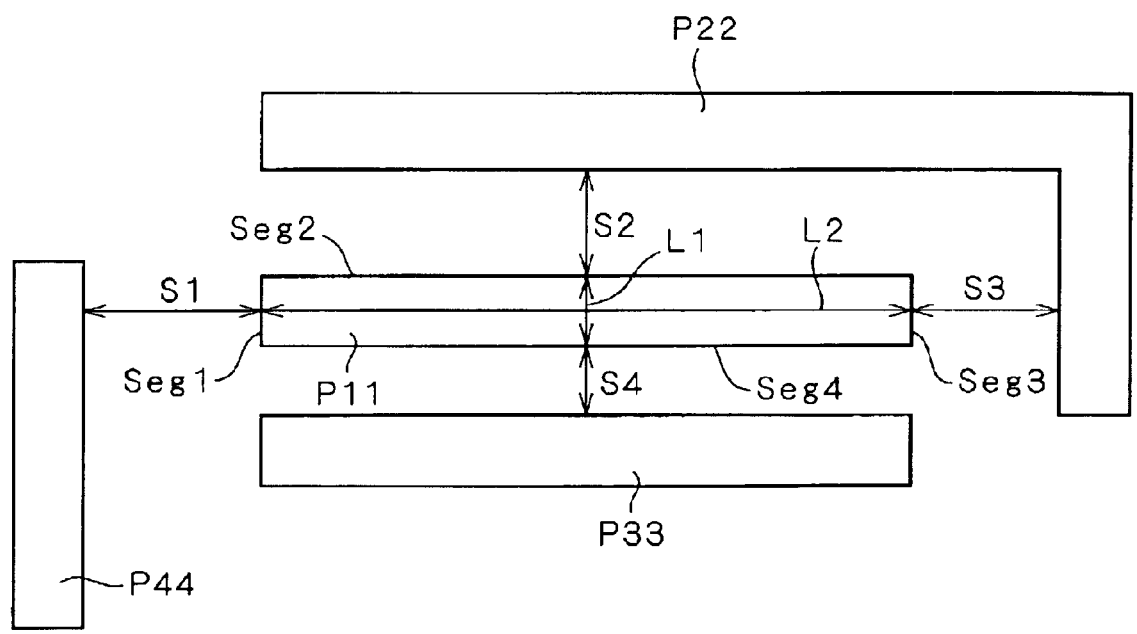
FIG. 17 is a diagram of a polygon that is a graphic data of a wiring pattern.

This error information is then fed back to the layout design step S102 in FIG. 16, in which the layout design is then reviewed.

Thus, in the layout data, each of the segments forming one of plural polygons is divided in accordance with the layout of its surrounding other polygon. Therefore, more accurate evaluation is executable in the step of evaluating the possibility of resolution of each segment. This results in a layout verification method that is higher in verification accuracy.

Figure 6:
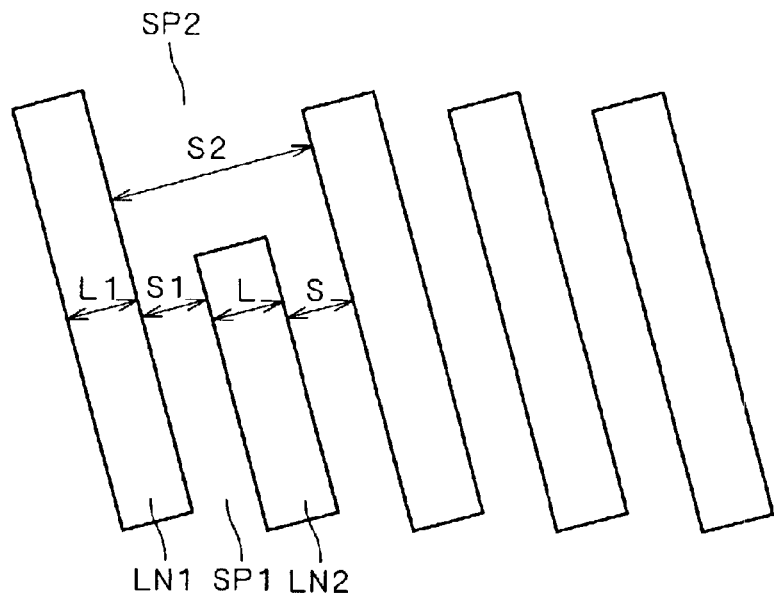
FIG. 6 is a diagram illustrating an exemplary wiring pattern of oblique lines.

Polygons to be evaluated here are not limited to wiring that extends horizontally or vertically. For instance, they may have such an oblique-line wiring pattern as shown in FIG. 6, in which wirings LN1, LN2 . . . and spaces SP1 . . . are obliquely disposed at a predetermined angle on a plane. In this instance, the right side of wiring LN1 is divided, by the presence of wiring LN2 adjacent only to part of the length of the right side, into two segments of one having space S1 and another having space S2.

Figure 7:
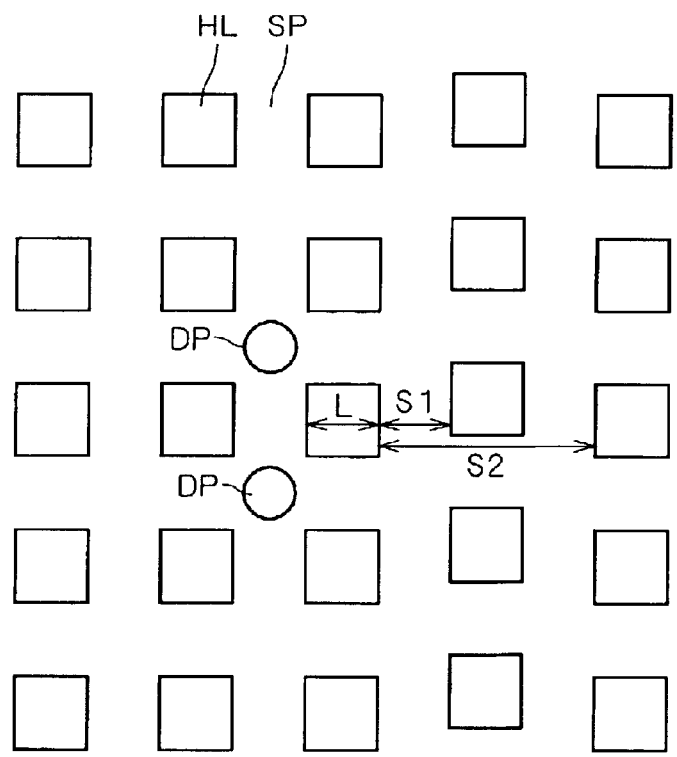
FIG. 7 is a diagram illustrating an exemplary hole pattern.

Besides oblique lines, such a hole pattern as shown in FIG. 7 may be adopted for polygon which takes a wiring width L as a contact hole or via hole diameter, and the width of space SP as a space width between holes. In this instance, a side of holes HL, only part of which is proximate to the adjacent hole, is divided into two segments of one having space S1 and another having space S2.

In this connection, when half tone technique is employed in the formation of a hole pattern, the presence of dimple should be considered. In the half tone technique, a shading part of a mask formed by a special material functions to shift the phase of diffraction light at the adjacent openings to eliminate interference, so that images of the adjacent openings are formed apart from each other. As the material of the mask, there can be used any material which is semi-transparent (having several percent of light transmittance) to exposure light, and of which phase is reversed to exposure the light passing through the openings.

When using the half tone technique, the shading part allows a slight light to pass therethrough. As a result, the secondary peaks of the light are overlapped with each other, and a pattern might be formed even at the location where no hole pattern is present. This is a dimple DP, which is often generated in the space surrounded by four holes, as shown in FIG. 7.

The occurrence of the dimple DP should be avoided. Therefore, the various data as shown in FIG. 18 preferably contain data of dimple margin, in addition to exposure margin and defocus margin.

Consideration of dimple margin is made, for example, by ascertaining whether there are portions having a light intensity more than a predetermined value in the light intensity distribution of space portions between holes. This predetermined value is used as a dimple margin.

Second Preferred Embodiment

A second preferred embodiment is a modification of the layout verification method of the first preferred embodiment. That is, there is added the following step. When an error information is outputted, with respect to a segment of which possibility of resolution is negative, its layout is corrected by the amount of correction thereof stored in the L/S matrix data. This makes it easy to obtain a suitable layout.

Figure 8:
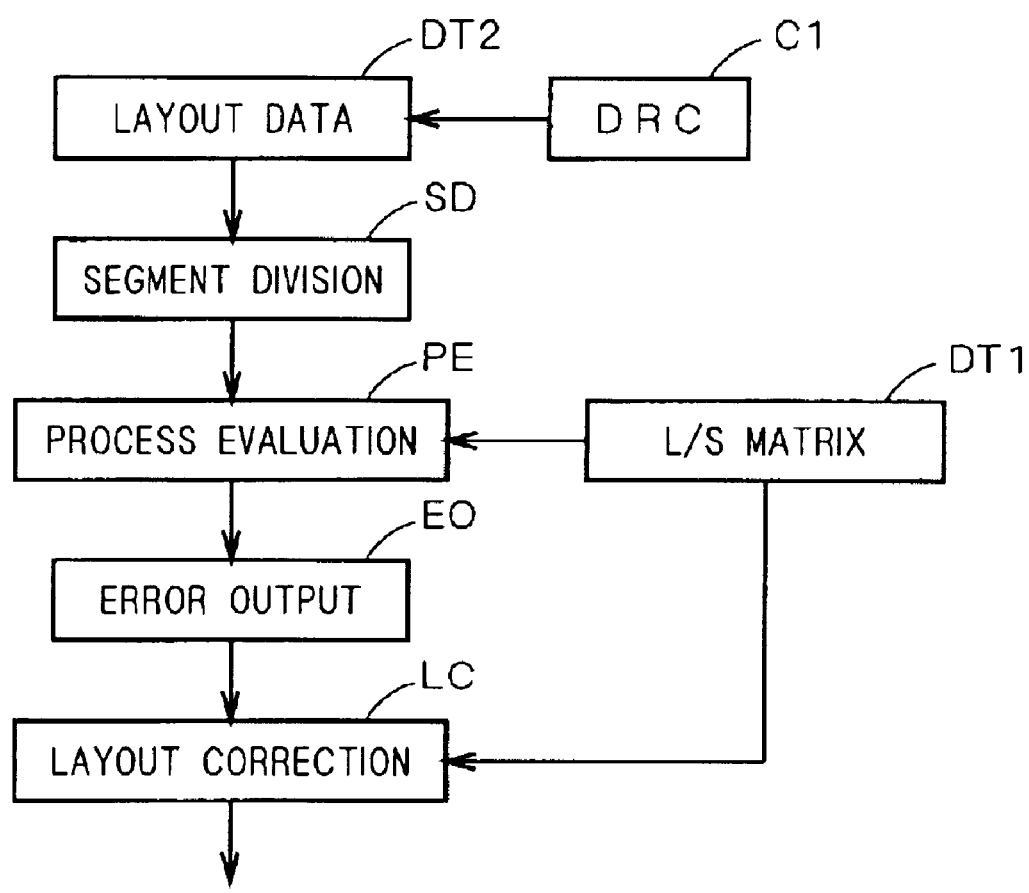
FIG. 8 is a flowchart illustrating a layout verification method according to a second preferred embodiment.
Figure 9:
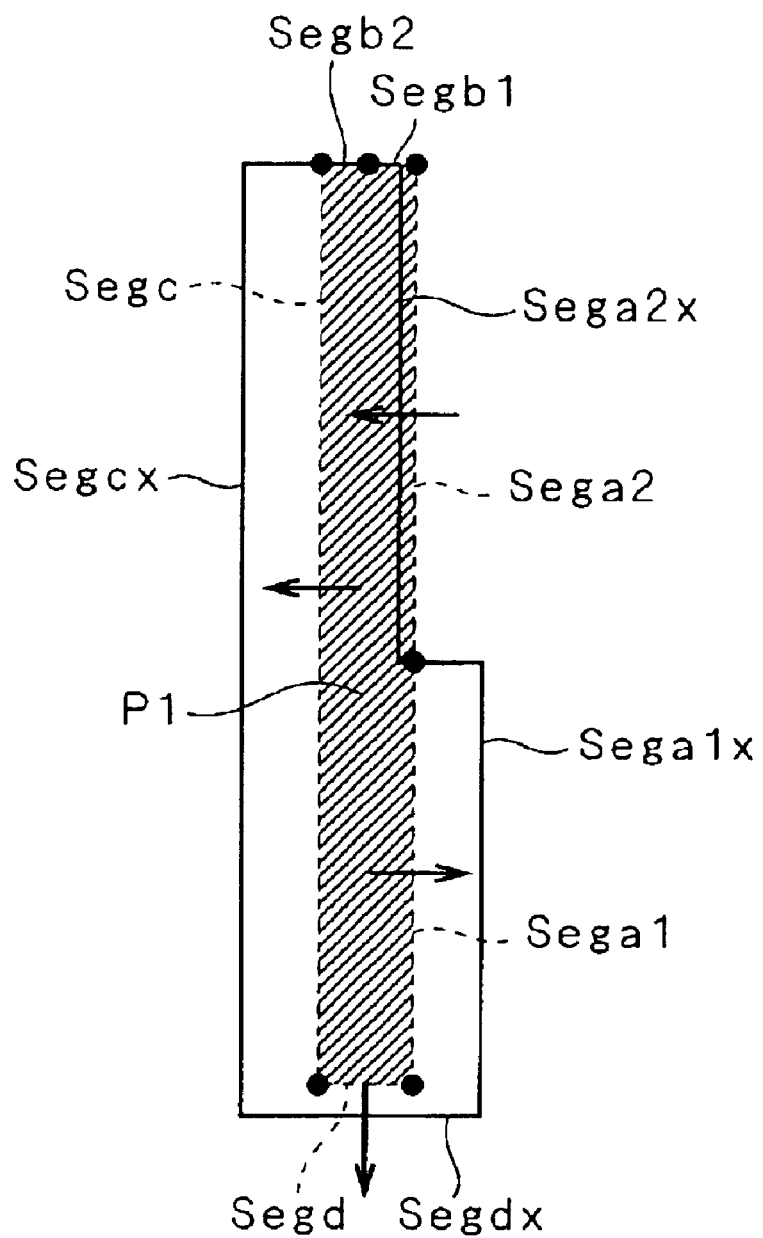
FIG. 9 is a diagram illustrating an instance that a polygon is corrected with the layout verification method of the second preferred embodiment.

FIG. 8 is a flowchart illustrating a layout verification method of the second preferred embodiment. FIG. 9 is a diagram illustrating an instance that correction is made for the polygon P1 in FIG. 3. As apparent from FIG. 8, the second preferred embodiment is the same as the first preferred embodiment, except for the addition of a layout correction step LC. The layout correction step LC is included in the layout design step S102 in FIG. 16.

Information of OPC amount is stored in every cell of the L/S matrix DT1. Provided that a segment layout can be corrected by such information. Even if judged that resolution is difficult or impossible, rearrangement of the segment makes possible the resolution in some cases.

As used herein, the information of OPC amount is information about the amount of correction by which the segment is shifted in the normal direction (either of two directions) to make possible the resolution of the segment. This information is obtainable through experiments or simulations for storing various data in every cell of the L/S matrix. The amount of correction that is the information of OPC amount may be obtained by considering the amount of layout shift resulting from the influence of etching, in addition to the amount of layout shift in photolithography.

Accordingly, on receipt of the OPC amount information from the L/S matrix DT1, such a layout correction as shown in FIG. 9 is performed with respect to each segment in the layout correction step LC. In FIG. 9, segment Sega1 is further removed to the right, resulting in segment Sega1x, and segment Sega2 is removed to the left, resulting in segment Sega2x. Segment Segc is removed to the left, resulting in segment Segcx. Segment Segd is removed downward, resulting in Segdx. Segments Segb1 and Segb2 is removed neither upward nor downward.

Since the segment layout correction makes the polygon not closed graphic, the following processing is needed. For example, the respective ends of segments are connected with each other, or the end of a segment is allowed to extend to obtain a point at which this segment's end comes into contact with the extended end of other segment. This point is used as a new polygon vertex. These can easily be performed with a known image processing technique.

Thus, a suitable layout can be obtained with ease by referring to the OPC amount information in the L/S matrix data and making layout correction by the required amount.

Note that the new polygon obtained by the foregoing correction should be subjected to verification, because each segment location is different from its original location in the L/S matrix.

However, it is estimated that repeated verification will fail to make possible the resolution. In preparation for this event, it is preferable to set a maximum limit on the number of times the verification is repeated.

Third Preferred Embodiment

A third preferred embodiment is also a modification of the layout verification method of the first preferred embodiment. This modification realizes a layout verification method that permits evaluation based on close consideration of wiring width and space width in the surroundings of segments by expressing a matrix setting of an L/S matrix in more detail.

Specifically, in the L/S matrix, information about the possibility of resolution and the various data shown in FIG. 18 are stored in association with a combination of the width of wiring not containing an aimed segment and/or the width of space not being most adjacent to the aimed segment, as well as the width of wiring containing the aimed segment and the width of space most adjacent to the aimed segment.

Figure 10:
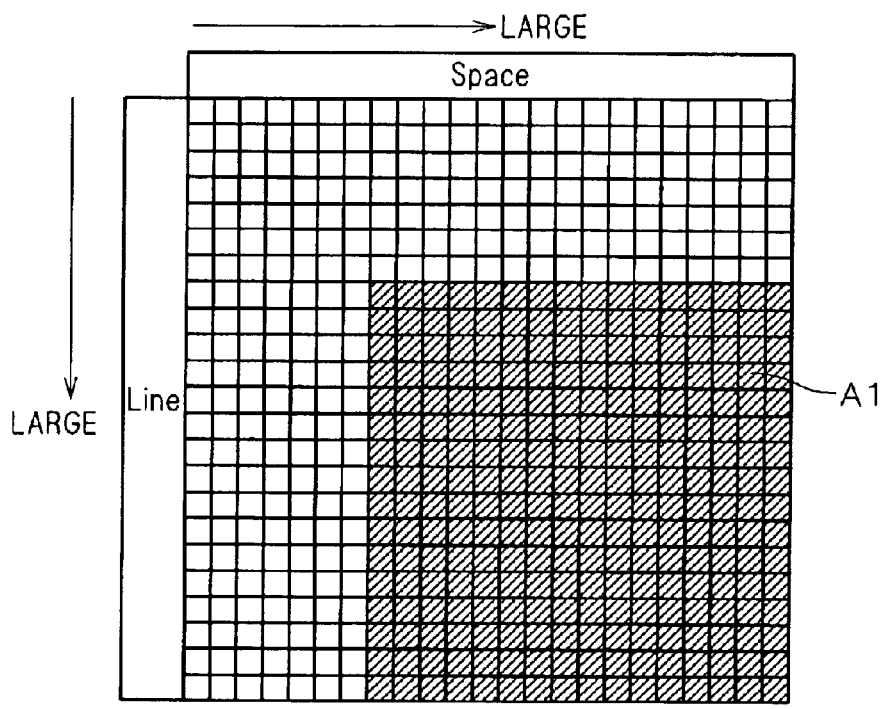
FIGS. 10 and 11 are diagrams expressing an L/S matrix schematically.
Figure 11:
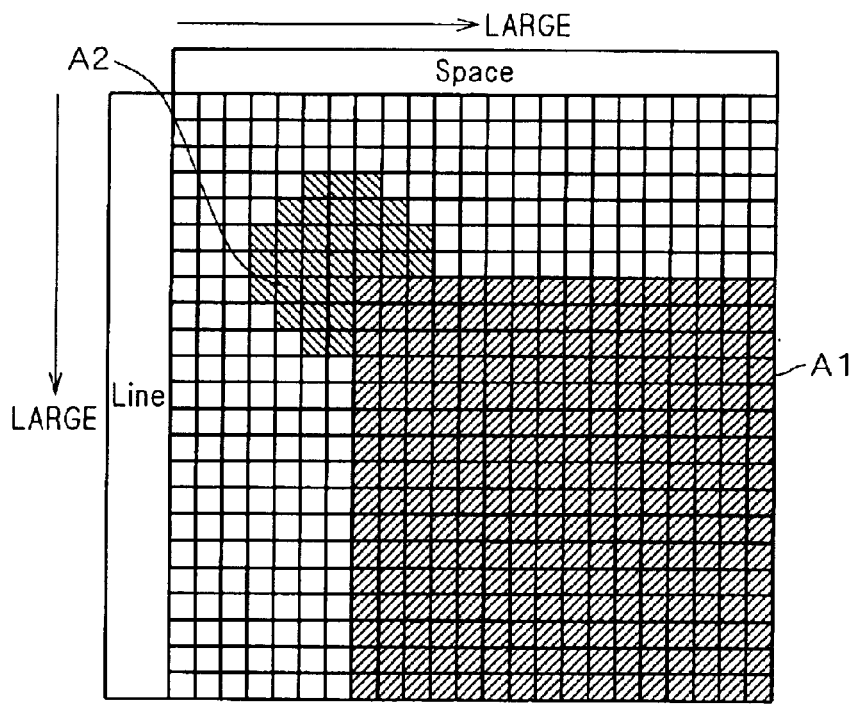

Basically, sufficient verification is executable by the L/S matrix that only the information of the possibility of resolution, i.e., "resolution is possible" or "resolution is impossible" is stored in every cell. FIGS. 10 and 11 express schematically the L/S matrix of FIG. 18. Although in these figures no specific values of line width L and space width S are indicated, it is set that the line width L is increased to the downward in the vertical direction and the space width S is increased to the right in the lateral direction.

Specifically, FIG. 10 is a table showing the possibility of resolution based on the result of calculation that is obtained by optical simulation, without employing any super resolution technique. Area of combinations of line width and space width, on which an optical image of a pattern made up of lines and spaces can be resolved on an image surface of optical system in photolithography (e.g., a resist), is represented by A1 that is indicated by slanting lines.

It is found that area A1 in a simple rectangle can be specified as a design rule, only by specifying a minimum line width and a minimum space width that indicate the resolution limit in photolithography technique.

On the other hand, FIG. 11 is a table showing the possibility of resolution based on the result of calculation that is obtained by optical simulation when the modified illumination method is employed as a super resolution technique. Area of combinations of line width and space width, on which an optical image of a pattern made up of lines and spaces can be resolved on a resist, is represented by A1 and A2 indicated by slanting lines. Area A2 surrounds the corner of area A1, which is inherent when an aperture for ring band illumination is used in the modified illumination method. It is found that the shape of the area where resolution is possible is complicated by the presence of area A2, and a complicated rule is necessary for specifying that area as a design rule.

In FIGS. 10 and 11, there are only two indexes forming the L/S matrix, that is, the width of wiring containing an aimed segment and the width of space most adjacent to the aimed segment.

Strictly speaking, not only the two indexes always exert an adverse influence on the resolution of the aimed segment. As a matter of fact, the width of wiring not containing the aimed segment and the width of space not being most adjacent to the aimed segment also exert an adverse influence on the resolution of the aimed segment. For instance, with reference to FIG. 12, the resolution of segment Seg10 is adversely influenced not only by width L10 of wiring containing this segment and width S10 of space most adjacent to the segment, but also width L20 of wiring not containing the segment and width S20 not being most adjacent to the segment.

Figure 13:
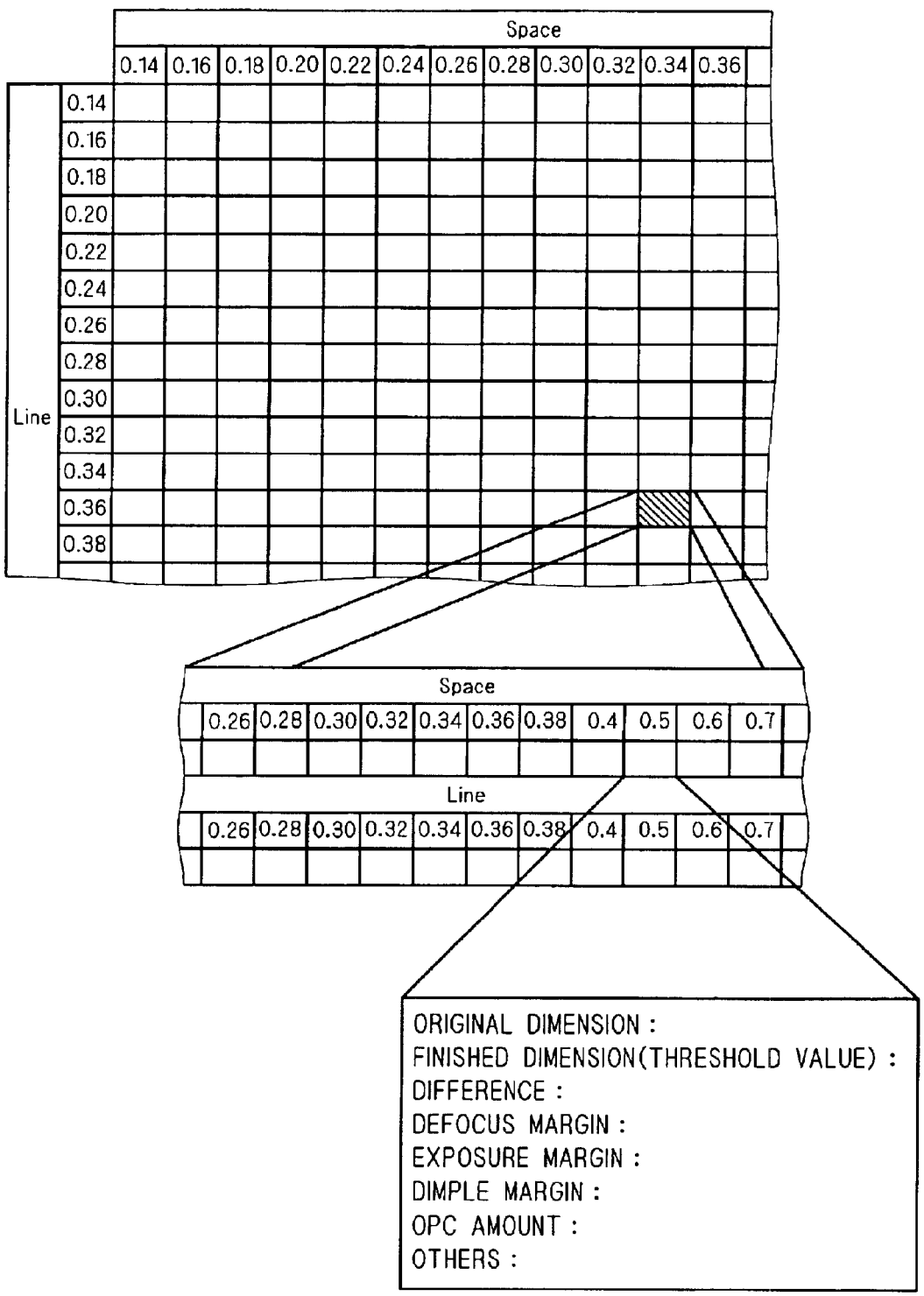
FIG. 13 is a diagram illustrating a multidimensional L/S matrix used in a layout verification method according to a third preferred embodiment.

Therefore, it is desirable to set indexes forming the L/S matrix as many as possible. An exemplary L/S matrix taking this into consideration is shown in FIG. 13, on which the ordinate and abscissa represent the wiring width L10 and the space width S10 in FIG. 12, respectively. Further, in every cell, space width S20 or wiring width L20 is disposed as an axis.

For instance, when the space width S20 is disposed as an additional axis, there is obtained a three-dimensional L/S matrix taking, as an index, the wiring width L10 and the space widths S10 and S20 in FIG. 12. Information of "resolution is possible" or "resolution is impossible" and various data are stored in every cell of the three-dimensional L/S matrix.

Likewise, when the wiring width L20 is disposed as an additional axis, there is obtained a three-dimensional L/S matrix taking, as an index, the wiring widths L10, L20 and the space width S10 in FIG. 12. Information of "resolution is possible" or "resolution is impossible" and various data are stored in every cell of the three-dimensional L/S matrix.

Likewise, when both of the space width S20 and the wiring width L20 are disposed as an additional axis, there is obtained a four-dimensional L/S matrix taking, as an index, the wiring widths L10 and L20 and the space widths S10 and S20 in FIG. 12. Information of "resolution is possible" or "resolution is impossible" and various data are stored in every cell of the four-dimensional L/S matrix.

Thus, in the third preferred embodiment, the information of "resolution is possible" or "resolution is impossible" and the various data are stored in association with the combination of the width of wiring containing an aimed segment and the widths of space most adjacent to the aimed segment, as well as the width of wiring not containing the aimed segment and/or the width of space not being most adjacent to the aimed segment. This permits evaluation that is based on close consideration of the wiring width and space width in the surroundings of the segments.

Fourth Preferred Embodiment

A fourth preferred embodiment relates to a layout verification apparatus that realizes the layout verification method according to first, second or third preferred embodiment. Each of the layout verification methods is realized by using, for example, a computer system as shown in FIG. 14.

Figure 14:
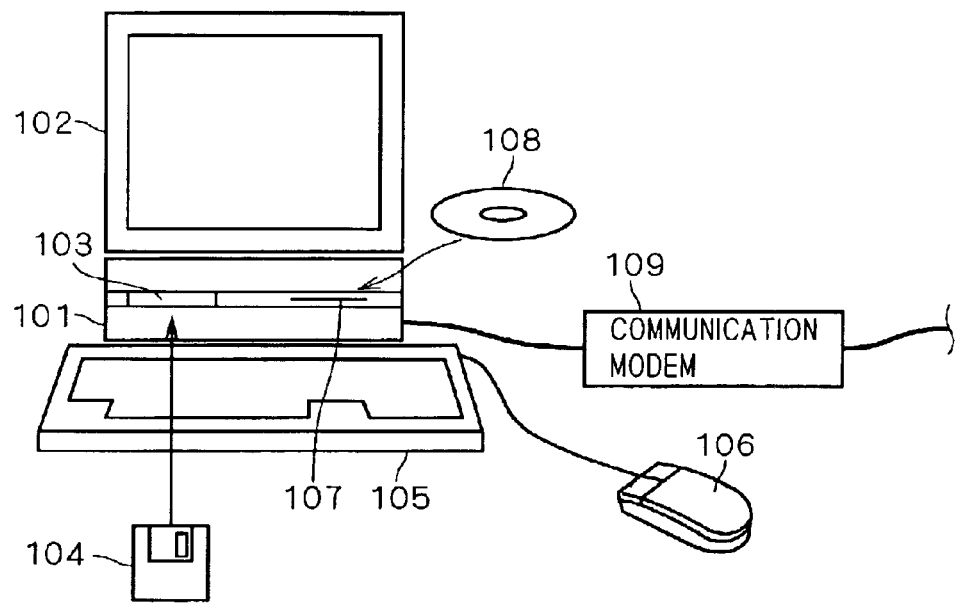
FIGS. 14 and 15 are diagrams illustrating the construction of a layout verification apparatus according to a fourth preferred embodiment.

Referring to FIG. 14, this computer system comprises: a computer body 101; display device 102, magnetic disk drive device 103 into which a magnetic disk 104 is inserted; keyboard 105; mouse 106; CD-ROM device 107 into which a CD-ROM (compact disk-read only memory) 108 is inserted; and communication modem 109.

The processing of the segment division step SD, process evaluation step PE, error output step EO, and layout correction step LC can be realized by executing a computer program on computer. In this instance, the program is fed by a storage medium, such as the magnetic disk 104, CD-ROM 108 or the like. The program can be propagated on a communication path in the form of signals, and also be downloaded on a storage medium.

The program is executed by the computer body 101. Layout verification is performed in the following manner that the operator operates the keyboard 105 or mouse 106 while watching the display device 102. The program may be fed from another computer to the computer body 101 through communication lines and then the communication modem 109.

Figure 15:
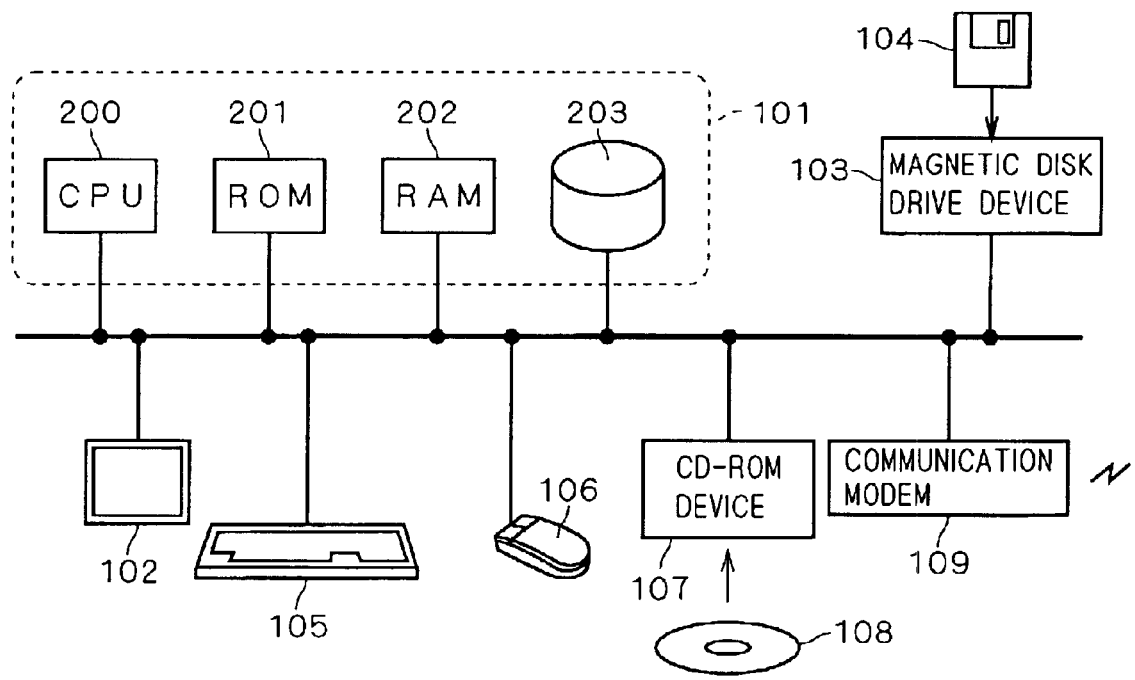

FIG. 15 is a block diagram of the computer system configuration shown in FIG. 14. The computer body 101 in FIG. 14 has CPU (central processing unit) 200, ROM (read only memory) 201, RAM (random access memory) 202, and hard disk 203.

The CPU 200 executes processing while inputting/outputting data among the display device 102, magnetic disk drive device 103, keyboard 105, mouse 106, CD-ROM device 107, communication modem 109, ROM 201, RAM 202, and hard disk 203.

The layout verification program stored in the magnetic disk 104 or CD-ROM 108 is temporarily stored in the hard disk 203 by the CPU 200. The CPU 200 loads the layout verification program from the hard disk 203 to the RAM 202, and executes the program to perform the layout verification.

The foregoing computer system is given only as example and without limitation. Any computer system can be used which can execute the layout verification program.

While the invention has been shown and described in detail, the foregoing description is in all aspects illustrative and not restrictive. It is therefore understood that numerous modifications and variations can be devised without departing from the scope of the invention.

What is claimed is:

1. A layout verification method using a layout data of a semiconductor integrated circuit, said layout data containing plural polygons indicating wiring patterns, said polygons being made up of plural segments that are sides, said method comprising the steps of:

(a) dividing plural segments forming one of said plural polygons in said layout data, based on a predetermined rule defined beforehand relative to the layout of other surrounding polygon;

(b) with respect to said segments divided and segments not divided, detecting a width of wiring containing each of said segments and a width of space most adjacent to each of said segments;

(c) evaluating the possibility of resolution of each of said segments by referring to data of conditions under which resolution can be performed, in which a predetermined conditione relative to the possibility of resolution of said segments in a wafer process is stored in association with a combination of said width of wiring and said width of space; and (d) outputting an error information when there is a segment of which possibility of resolution is negative based on the result of evaluation in said step (c).

2. The layout verification method according to claim 1, wherein;

said predetermined rule means that:

no division is performed when one segment is, over its entire length, most adjacent to said other polygon; and division is performed when one segment is, only in part of its length, most adjacent to said other polygon within a predetermined distance.

3. The layout verification method according to claim 1, wherein;

a layout correction amount of each of said segments is stored in said data of conditions under which resolution can be performed, said method further comprising the step of:

(e) when said error information is outputted in said step (d), correcting by said correction amount the layout of a segment of which possibility of resolution is negative, while referring to said data of conditions under which resolution can be performed.

4. The layout verification method according to claim 1, wherein;

in said combination of said width of wiring and said width of space in said data of conditions under which resolution can be performed, there is included a combination of a width of wiring containing an aimed segment of said segments and a width of space most adjacent to said aimed segment, as well as a width of wiring not containing said aimed segment and/or a width of space not being most adjacent to said aimed segment.

5. The layout verification method according to claim 1, wherein;

said polygons contained in said layout data are wiring patterns of oblique lines where said wiring and said space are disposed obliquely at a predetermined angle on a plane.

6. The layout verification method according to claim 1, wherein;

said polygons contained in said layout data are hole patterns taking said width of wiring as a hole diameter and said width of space as a width of space between holes.

7. The layout verification method according to claim 1, wherein;

said predetermined condition is defined based on a defocus margin.

* * * * *